(12) United States Patent
Eun

(10) Patent No.: US 9,761,563 B2
(45) Date of Patent: Sep. 12, 2017

(54) MULTI-CHIP PACKAGE HAVING A STACKED PLURALITY OF DIFFERENT SIZED SEMICONDUCTOR CHIPS, AND METHOD OF MANUFACTURING THE SAME

(71) Applicant: Hyung-lae Eun, Seongnam-si (KR)

(72) Inventor: Hyung-lae Eun, Seongnam-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 15/189,387

(22) Filed: Jun. 22, 2016

(65) Prior Publication Data

US 2016/0300819 A1    Oct. 13, 2016

Related U.S. Application Data

(63) Continuation of application No. 13/762,506, filed on Feb. 8, 2013, now Pat. No. 9,397,034, which is a
(Continued)

(30) Foreign Application Priority Data

Aug. 8, 2006  (KR) .................. 10-2006-0074658

(51) Int. Cl.
*H01L 25/065* (2006.01)
*H01L 21/768* (2006.01)
(Continued)

(52) U.S. Cl.
CPC .... *H01L 25/0657* (2013.01); *H01L 21/76898* (2013.01); *H01L 23/3128* (2013.01);
(Continued)

(58) Field of Classification Search
CPC ...................................................... H01L 23/48
See application file for complete search history.

(56) References Cited

U.S. PATENT DOCUMENTS

| 5,481,133 A | 1/1996 | Hsu |
| 7,122,457 B2 | 10/2006 | Tanida et al. |
(Continued)

FOREIGN PATENT DOCUMENTS

| JP | 08-264712 | 10/1996 |
| JP | 2001-044357 A | 2/2001 |
(Continued)

OTHER PUBLICATIONS

Japanese Office Action mailed Nov. 4, 2015.
(Continued)

*Primary Examiner* — Marvin Payen
(74) *Attorney, Agent, or Firm* — Harness, Dickey & Pierce, P.L.C.

(57) ABSTRACT

Provided is a multi-chip package in which a plurality of semiconductor chips having different sizes are stacked. A multi-chip package may include a substrate, and a plurality of semiconductor chips stacked on the substrate, each of the plurality of semiconductor chips having a different size. Each of the plurality of semiconductor chips including a pad group and a reference region associated with the pad group, each pad group having a plurality of pads, and the plurality of pads in each pad group located at same coordinates with respect to the associated reference region, and each of the plurality of semiconductor chips having their reference regions vertically aligned.

20 Claims, 10 Drawing Sheets

Related U.S. Application Data continuation of application No. 11/882,505, filed on Aug. 2, 2007, now Pat. No. 8,395,259.

(51) Int. Cl.
| | |
|---|---|
| *H01L 23/31* | (2006.01) |
| *H01L 23/00* | (2006.01) |
| *H01L 25/00* | (2006.01) |
| *H01L 23/498* | (2006.01) |

(52) U.S. Cl.
CPC .... *H01L 23/3142* (2013.01); *H01L 23/49811* (2013.01); *H01L 23/49816* (2013.01); *H01L 23/49827* (2013.01); *H01L 24/06* (2013.01); *H01L 24/13* (2013.01); *H01L 24/17* (2013.01); *H01L 24/73* (2013.01); *H01L 25/50* (2013.01); *H01L 24/45* (2013.01); *H01L 24/48* (2013.01); *H01L 24/81* (2013.01); *H01L 24/85* (2013.01); *H01L 2224/0401* (2013.01); *H01L 2224/06155* (2013.01); *H01L 2224/06156* (2013.01); *H01L 2224/06165* (2013.01); *H01L 2224/13025* (2013.01); *H01L 2224/13099* (2013.01); *H01L 2224/16145* (2013.01); *H01L 2224/16225* (2013.01); *H01L 2224/16237* (2013.01); *H01L 2224/32145* (2013.01); *H01L 2224/32225* (2013.01); *H01L 2224/45139* (2013.01); *H01L 2224/48091* (2013.01); *H01L 2224/48227* (2013.01); *H01L 2224/73204* (2013.01); *H01L 2224/73257* (2013.01); *H01L 2224/81801* (2013.01); *H01L 2224/85* (2013.01); *H01L 2224/9202* (2013.01); *H01L 2225/0651* (2013.01); *H01L 2225/06513* (2013.01); *H01L 2225/06517* (2013.01); *H01L 2225/06527* (2013.01); *H01L 2225/06541* (2013.01); *H01L 2225/06551* (2013.01); *H01L 2225/06555* (2013.01); *H01L 2225/06562* (2013.01); *H01L 2225/06586* (2013.01); *H01L 2924/00014* (2013.01); *H01L 2924/014* (2013.01); *H01L 2924/01006* (2013.01); *H01L 2924/01015* (2013.01); *H01L 2924/01033* (2013.01); *H01L 2924/01047* (2013.01); *H01L 2924/01074* (2013.01); *H01L 2924/01082* (2013.01); *H01L 2924/12042* (2013.01); *H01L 2924/15311* (2013.01); *H01L 2924/181* (2013.01)

(56) References Cited

U.S. PATENT DOCUMENTS

| | | | |
|---|---|---|---|
| 7,253,527 | B2 | 8/2007 | Tanida et al. |
| 7,276,799 | B2 | 10/2007 | Lee et al. |
| 7,537,959 | B2 | 5/2009 | Lee et al. |
| 7,977,156 | B2 | 7/2011 | Lee et al. |
| 8,368,231 | B2 | 2/2013 | Lee et al. |
| 2002/0074637 | A1 | 6/2002 | McFarland |
| 2003/0107119 | A1 | 6/2003 | Kim |
| 2005/0146009 | A1 | 7/2005 | Corisis et al. |
| 2005/0161837 | A1 | 7/2005 | Matsui |
| 2005/0170600 | A1 | 8/2005 | Fukuzo |
| 2005/0230804 | A1 | 10/2005 | Tanida et al. |

FOREIGN PATENT DOCUMENTS

| | | |
|---|---|---|
| JP | 2004-148465 A | 5/2004 |
| JP | 2004327474 A | 11/2004 |
| JP | 2004342690 A | 12/2004 |
| JP | 2005072596 A | 3/2005 |
| JP | 2005-191255 A | 7/2005 |
| JP | 2005-217205 A | 8/2005 |
| JP | 2006-210892 A | 8/2006 |
| JP | 2007-036184 A | 2/2007 |
| JP | 05-063137 B2 | 10/2012 |
| KR | 1020050104164 A | 11/2005 |
| KR | 1020060007530 A | 1/2006 |
| WO | WO-2005/093834 A1 | 10/2005 |

OTHER PUBLICATIONS

Office Action for corresponding Japanese application No. 2014-021330 dated Feb. 17, 2015.

Japanese Office Action for corresponding JP Appln. No. 2007-205880 mailed Jan. 24, 2012.

112,122 OR 132    110,120 OR 130

112,122 OR 132    110,120 OR 130

MULTI-CHIP PACKAGE HAVING A STACKED PLURALITY OF DIFFERENT SIZED SEMICONDUCTOR CHIPS, AND METHOD OF MANUFACTURING THE SAME

PRIORITY CLAIM

This application is a continuation application of and claims priority under 35 U.S.C. §120/121 to U.S. application Ser. No. 13/762,506 filed Feb. 8, 2013, which is a continuation application of U.S. application Ser. No. 11/882,505 (now U.S. Pat. No. 8,395,259) filed Aug. 2, 2007, which claims priority under 35 U.S.C. §119 to Korean Patent Application No. 10-2006-0074658 filed on Aug. 8, 2006 in the Korean Intellectual Property Office, the contents of each of which are hereby incorporated herein by reference in their entirety and for all purposes.

BACKGROUND

1. Field of the Invention

Example embodiments of the present invention may relate to a multi-chip package, and more particularly, to a multi-chip package having a stacked plurality of different sized semiconductor chips.

2. Description of the Related Art

In response to recent developments in the semiconductor industry and increased user demands, electronic devices are getting smaller and lighter. Therefore, semiconductor chip packages, which may be considered the core component of an electronic device, are also getting smaller and lighter. In this regard, a stacked chip package, in which a plurality of semiconductor chips are vertically stacked on a mounting substrate, and a wafer level package, in which semiconductor chips are separated into individual devices after they are package in a wafer, have been proposed. The stacked semiconductor chip package and the wafer level package significantly contribute to the reduction in size, weight, and mounting area at a higher extent than in the case of a single chip package having a single semiconductor chip.

Also, the rapid development in mobile products is increasing the demand for a system-in-package (SIP) and a multi-chip package (MCP) in which various types of semiconductor devices, for example, a DRAM, an SRAM, a flash memory, and a CPU may be stacked on a substrate.

The MCP may be stacked with different types of semiconductor chips, each of the semiconductor chips having different sizes; therefore, it is not possible to manufacture the MCP at a wafer level. However, it is possible to manufacture a multi-chip package at a chip level. The semiconductor chips should be connected to a printed circuit board by wire bonding, because pad locations on each of the semiconductor chips may be different.

When using bonding wires, for example, stack wires, a minimum interval space between the wires should be maintained, and a printed circuit board should also have a minimum area in order to prevent insulation problems and/or crosstalk between the wires. Therefore, a package employing the bonding wires generally has a larger size than that of a wafer level package.

SUMMARY

The example embodiments of the present invention may provide a multi-chip package manufactured at a chip level, in which a plurality of chips having different sizes are stacked without multi-layered wires, and a method of manufacturing the same.

In an example embodiment, a multi-chip package may include a substrate, and a plurality of semiconductor chips stacked on the substrate, each of the plurality of semiconductor chips having a different size. Each of the plurality of semiconductor chips including a pad group and a reference region associated with the pad group, each pad group having a plurality of pads, and the plurality of pads in each pad group located at same coordinates with respect to the associated reference region, and each of the plurality of semiconductor chips having their reference regions vertically aligned.

In another example embodiment, a method of manufacturing a multi-chip package may include providing a substrate, and stacking a plurality of semiconductor chips on the substrate, each of the plurality of semiconductor chip having a different size. Each of the plurality of semiconductor chips including a pad group and a reference region associated with the pad group, each pad group having a plurality of pads, and the plurality of pads in each pad group located at same coordinates with respect to the associated reference region, and each of the plurality of semiconductor chips having their reference regions vertically aligned.

BRIEF DESCRIPTION OF THE DRAWINGS

Features of example embodiments of the present invention may become more apparent with the detailed description thereof with reference to the attached drawings in which.

DETAILED DESCRIPTION OF THE EXAMPLE EMBODIMENTS

Figure 1:
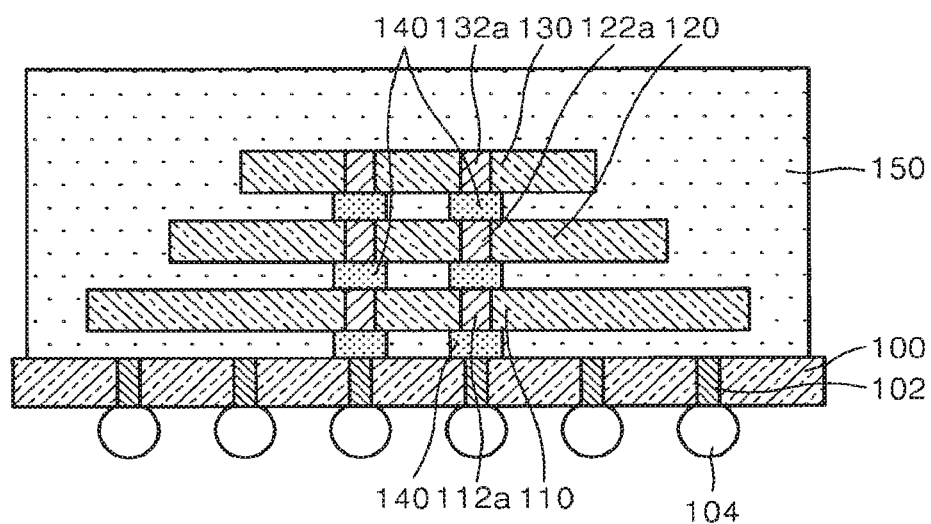
FIG. 1 is a cross-sectional view of a multi-chip package in which each of a plurality of semiconductor chips has a center pad group according to an example embodiment of the present invention.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An example embodiment of the present invention may provide a multi-chip package having a stacked plurality of semiconductor chips, each of the semiconductor chip being different sizes without using multiple (or multilayered) wires.

In the multi-chip package of the example embodiment, each of the semiconductor chips may include pads at desired coordinates with reference to the same reference position, and may be stacked and connected to one another such that the pads correspond to one another. Thus, a multi-chip package may be provided, which may be advantageous for a wafer level package.

FIG. 1 is a cross-sectional view of a multi-chip package in which each of a stacked plurality of semiconductor chips has a center pad group according to an example embodiment of the present invention.

Referring to FIG. 1, the multi-chip package may include a plurality of first, second, and third semiconductor chips 110, 120, 130 stacked on a mounting substrate 100, for example, a printed circuit board. Each of the plurality of semiconductor chips 110, 120, and 130 may be of a different size and may perform different functions. Each of the semiconductor chips 110, 120, 130, may be one of a DRAM, SRAM, flash memory, processor, etc. In the example embodiment, the semiconductor chips 110, 120 and 130 are stacked in order of decreasing size; however, the present invention is not limited to this arrangement.

Figure 2:
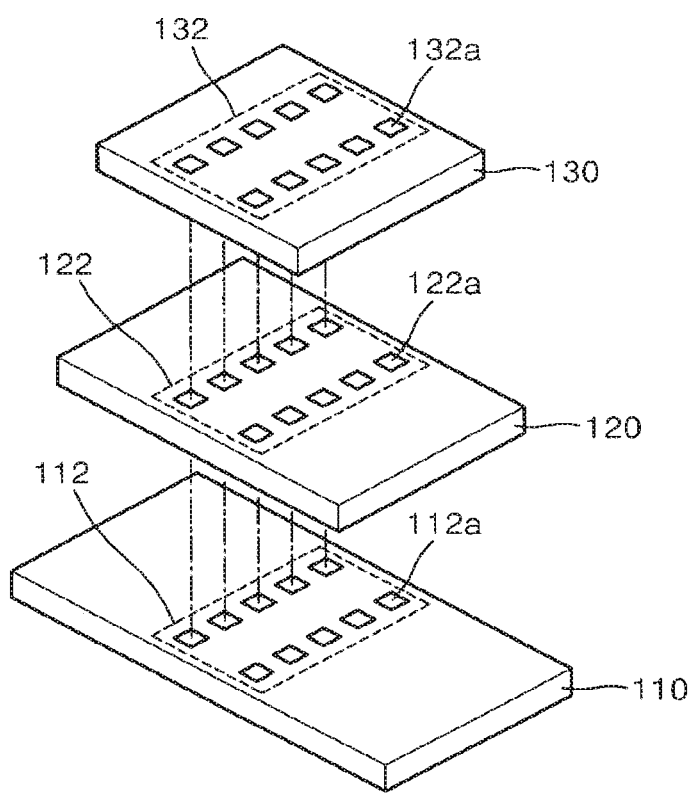
FIG. 2 is an exploded perspective view of the plurality of semiconductor chips of FIG. 1, according to an example embodiment of the present invention.

As illustrated in FIG. 2, the semiconductor chips 110, 120, and 130 may respectively have pad groups 112, 122, and 132 for external electrical connection of electrodes (not shown) inside the semiconductor chips 110, 120, and 130. The pad groups 112, 122, and 132 may respectively include a plurality of pads 112a, 122a and 132a arranged at desired intervals (d) (see FIG. 3) in a first direction. The pads 112a, 122a, and 132a may be formed into a via contact structure through the semiconductor chips 110, 120, and 130, respectively. In other words, as shown in FIG. 1, the pads 112a, 122a, and/or 132a may penetrate through the semiconductor chips 110, 120, and/or 130, and have exposed upper and lower ends. Although the pads 112a, 122a, or 132a may be arranged in a dual column arrangement in the example embodiment, the example embodiment is not limited thereto, and the pads 112a, 122a, or 132a may be arranged in a single column or greater than the columns.

Also, the pads 112a, 122a, and 132a constituting the pad groups 112, 122 and 132 may have the same arrangement and the same interval (d).

The semiconductor chips 110, 120, and 130 may be stacked such that the pad groups 112, 122, and 132 may face one another. The pad groups 112, 122, and 132 may be arranged in the same region in each of the semiconductor chips 110, 120, and 130, for example, at a central region or an edge region. The arrangement of the pad groups 112, 122, and 132 in the same region of each of the semiconductor chips 110, 120 and 130 is not essential from an electrical point of view, but may contribute to area reduction of the semiconductor chip package.

The order of the pad arrangement of the pad groups 112, 122, and 132 may be the same in each of the semiconductor chips 110, 120, and 130, therefore, the pads 112a, 122a, and 132a receiving the same signal may face one another when the semiconductor chips are stacked.

Each of the semiconductor chips 110, 120, and 130 may have an active surface. The semiconductor chips 110, 120, and 130 may be staked with their active surfaces facing in the same direction, facing each other or in other various combinations thereof.

The pads 112a, 122a, and 132a facing each another by the stacking of the semiconductor chips 110, 120, and 130 may be electrically connected together by connection members, for example, bumps 140. One of the plurality of semiconductor chips 110, 120, and 130 may be electrically connected to the mounting substrate 100. In the example embodiment, the semiconductor chip 110 may be connected by the bump 140 to the mounting substrate 100.

In order to protect the plurality of semiconductor chips 110, 120, and 130 stacked on the mounting substrate 100, a sealing material 150 may be formed, and conductive balls 104, used as transfer paths for an external signal, may be attached underneath the mounting substrate 100.

A reference numeral 102 represents a stud, which may provide an electrical path to the mounting substrate 100. The stud 102 may be electrically connected to the conductive ball 104.

Figure 3:
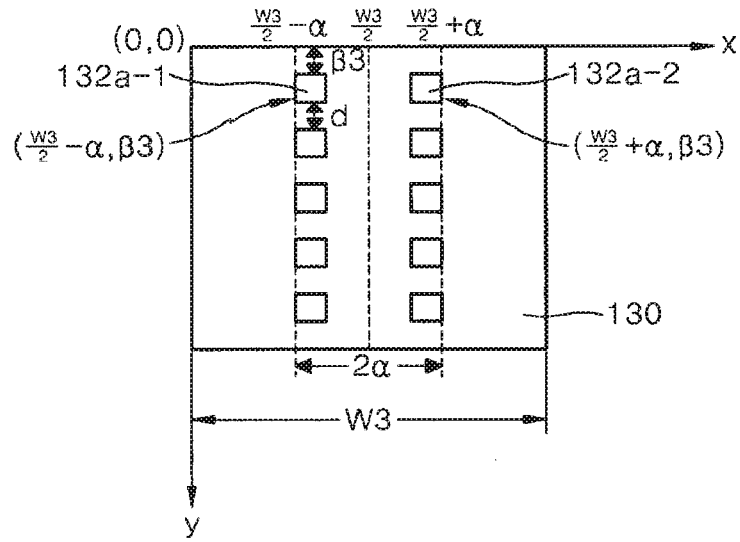
FIG. 3 is a plan view showing location of pads of the plurality of semiconductor chips of FIG. 1, according to an example embodiment of the present invention.
Figure 3:
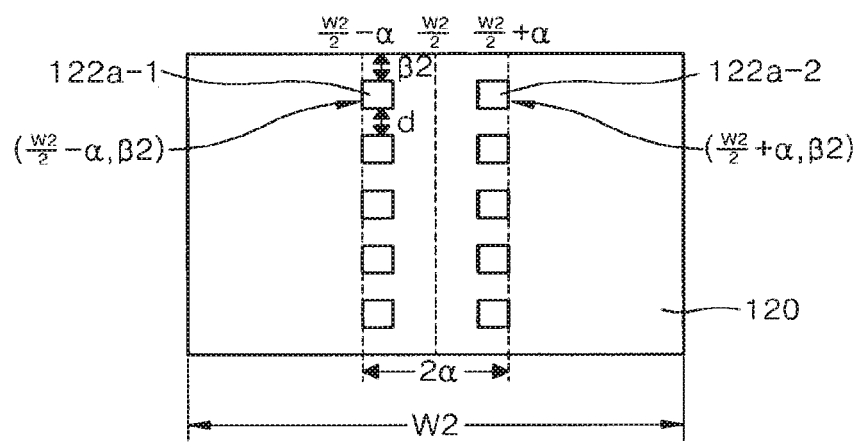
Figure 3:
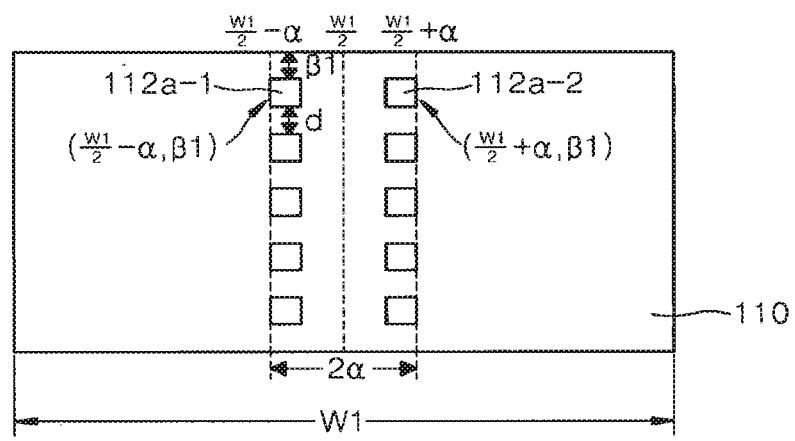

In the example embodiment, the pad groups may be disposed at a central region of the semiconductor chips 110, 120, and 130. In this case, as illustrated in FIG. 3, "x" and "y" coordinates of a pair of pads 112a, 122a, and 132a on the uppermost row are (width of semiconductor chip/2−α, β) and (width of semiconductor chip/2+α, β), respectively. A pair of pads on the next row (e.g., the second uppermost row) may be arranged at a "d" distance along the x-coordinate axis from the pair of pads on the uppermost row, and the remaining pairs of pads may be arranged at the same distance "d" along the y-coordinate axis from the previous row.

In more detail, assuming that the width of the semiconductor chip 110 is W1, the (x, y) coordinates of the pair of pads 112a-1 and 112a-2 on the uppermost row are (W1/2−α, β1) and (W1/2+α, β1), respectively; and, the x coordinates of the pair of pads 112a-1 and 112a-2 are symmetric with respect to a centerline of the semiconductor chip 110. Also, assuming that a width of the semiconductor chip 120 is W2, (x, y) coordinates of a pair of pads 122a-1 and 122a-2 on the uppermost row are (W2/2−α, β2) and (W2/2+α, β2), respectively; and, the x coordinates of the pair of pads 122a-1 and 122a-2 are symmetric with respect to a center line of the semiconductor chip 120. Assuming that a width of the semiconductor chip 130 is W3, (x, y) coordinates of a pair of pads 132a-1, 132a-2 on the uppermost row are (W3/2−α, β3) and (W3/2a, β3), respectively; and, the x coordinates of the pair of pads 132a-1 and 132a-2 are symmetric with respect to a center line of the semiconductor chip 130. The y coordinates β1, β2, and β3 of the semiconductor chips 110, 120 and 130 may have the same value or may be greater in proportion to the widths of the semiconductor chips 110, 120, and 130 in the order of β1, β2 and β3. Furthermore, α may be set in consideration of the size of the pads 112a, 122a, and 132a, respectively, and may be in a range of about 30 to 300 µm. In this arrangement, data skew problems caused by data loading may be reduced/prevented.

Figure 4A:
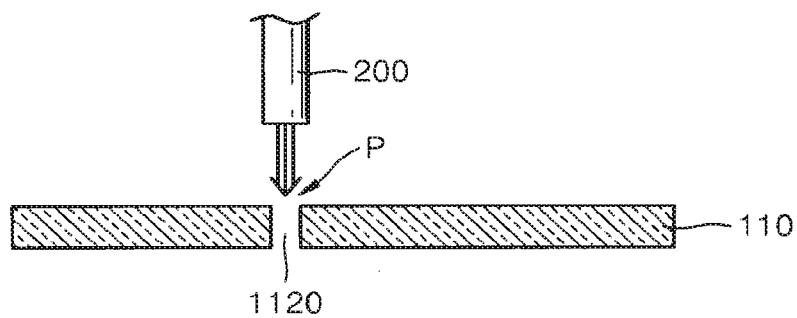
FIGS. 4A and 4B are cross-sectional views illustrating a method of forming a through-hole via pad according to an example embodiment of the present invention.
Figure 4B:
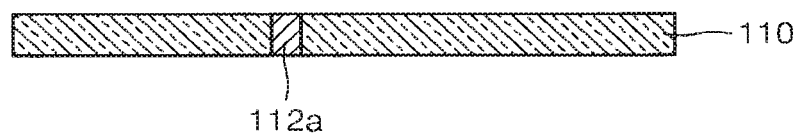

To manufacture the pad 112a, a via hole 112O may be formed at a region (P) as illustrated in FIG. 4A. Thereafter, the via hole 112O may be filled with a conductive material to form the pad 112a as illustrated in FIG. 4B. The via hole 112O may be formed by a laser drilling method using a laser drill 200. The size of the via hole 112O may be the same as or smaller than the size of the pad 112a. Also, the size of the via hole 112O may be adjusted according to the intensity of the laser (amount of radiation).

Figure 5A:
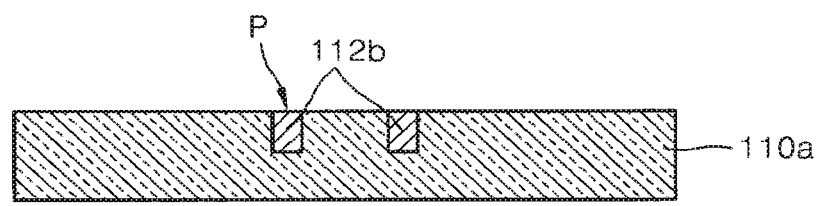
FIGS. 5A and 5B are cross-sectional views illustrating a method of forming a through-hole via pad according to another example embodiment of the present invention.
Figure 5B:
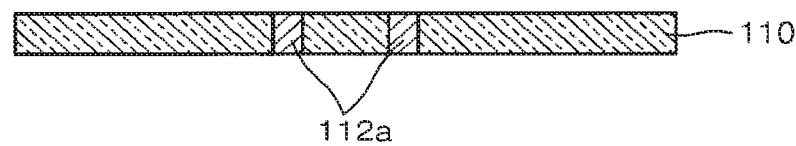

The pad 112a may be formed in a trench type during the wafer manufacturing process instead of the laser drilling method. For example, as illustrated in FIG. 5A, after providing a wafer 110a, a trench may be formed in a region (P), and a conductive material 112b may be provided in the trench. As illustrated in FIG. 5B, after finalizing a device on the wafer 110a, a wafer back grinding method may be performed to expose and form the pad 112a. Although only the first semiconductor chip 110 and the first via contact 112a have been illustrated in the FIGS. 4A-5B, the aforementioned structure and the method of manufacture may be applied to the second and third semiconductor chips 120, 130 and the via contacts 122a, 132a, respectively.

Figure 9:
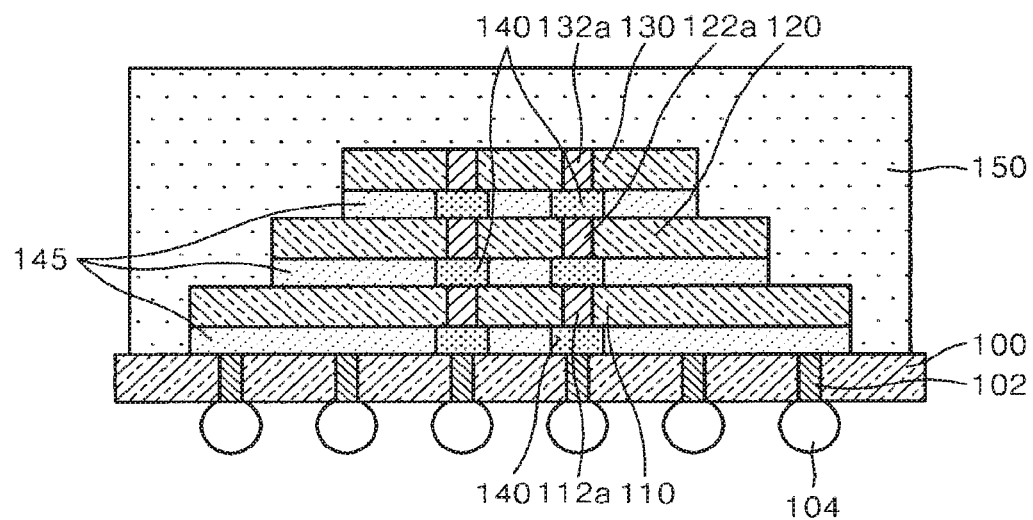
FIG. 9 is a cross-sectional view of a multi-chip package in which adhesive agents are interposed between a plurality of semiconductor chips according to an example embodiment of the present invention.

Referring to FIG. 9, adhesive agents (layers) 145 (see also FIGS. 17A-17B) may be applied between the semiconductor chips 110, 120, 130 and the mounting substrate 100. The adhesive agents interposed between the semiconductor chips 110, 120, 130 and the mounting substrate 100 may increase an adhesive force, may serve as spacers to support the semiconductor chips 110, 120, 130 and the mounting substrate 100, and may reduce/prevent warpage.

Figure 6:
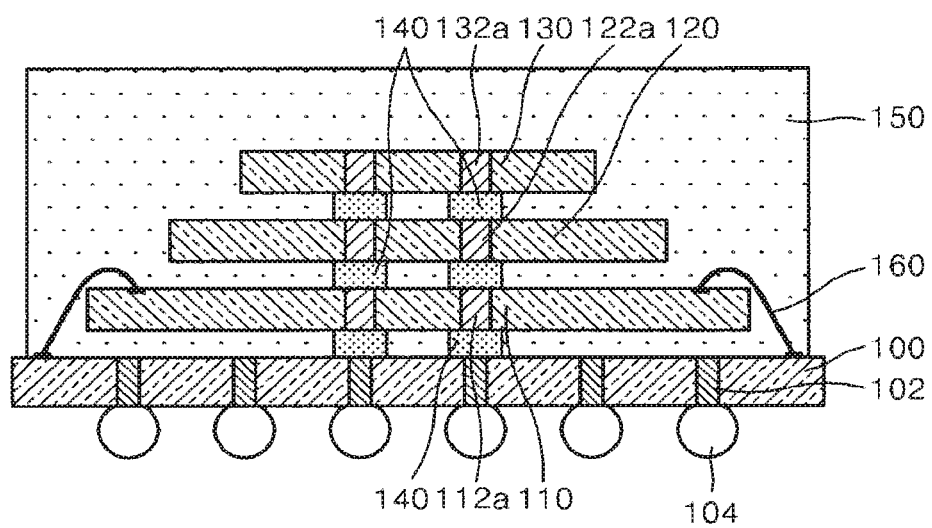
FIGS. 6 through 8 are cross-sectional views of a multi-chip package in which a mounting substrate and a semiconductor chip are electrically connected by a wire bonding according to an example embodiment of the present invention.
Figure 7:
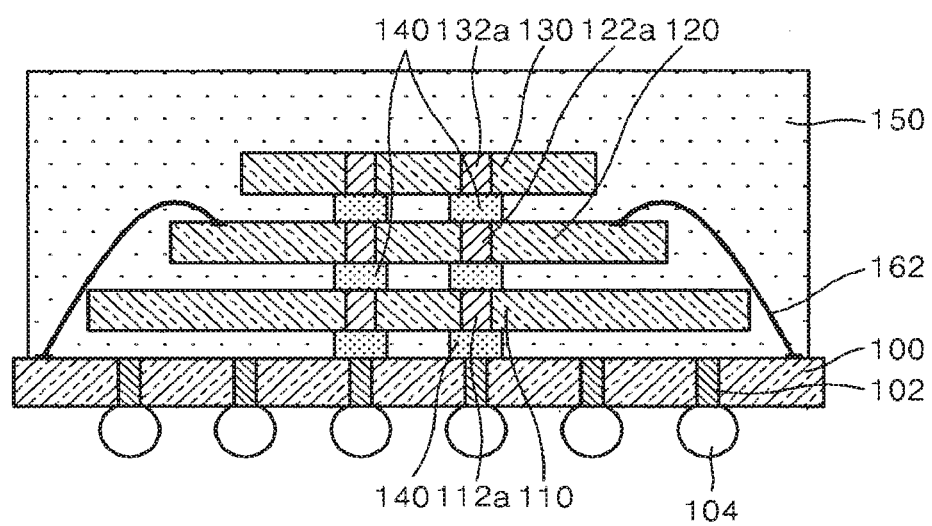
Figure 8:
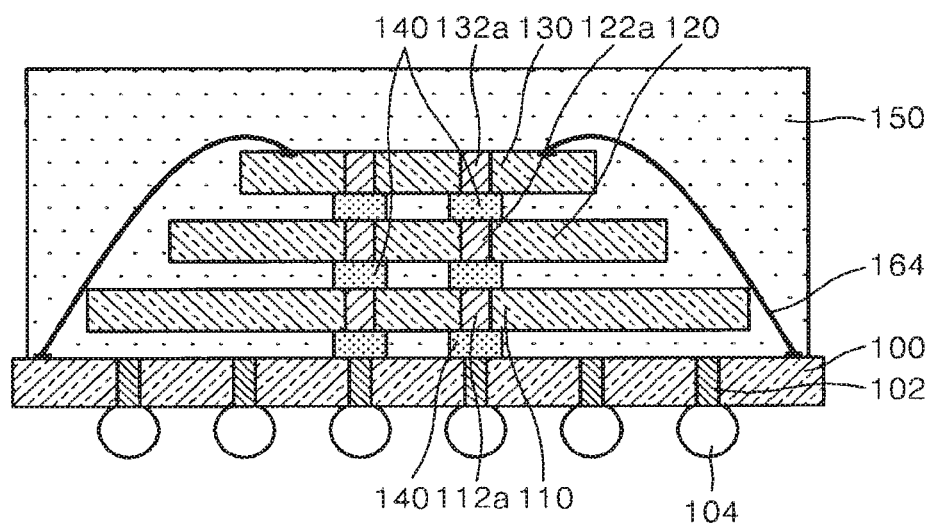

In addition, as illustrated in FIGS. 6 through 9, the mounting substrate 100 and one of the semiconductor chips 110, 120, and 130 may be bonded together by wires 160, 162, and/or 164, respectively. That is, the mounting substrate 100 may be selectively wire-bonded with the semiconductor chip 110 as illustrated in FIG. 6, may be selectively wire-bonded with the semiconductor chip 120 as illustrated in FIG. 7, and/or may be selectively wire-bonded with the semiconductor chip 130 as illustrated in FIG. 8. The semiconductor chips 110, 120, and 130 wire-bonded with the mounting substrate 100 may further include additional pads at an edge portion for an electrical connection with the mounting substrate 100, and the active surface on the semiconductor chip may face upwards. The additional pad may be formed only at the active surface of the semiconductor chip or may be formed through the semiconductor chip. Even though the mounting substrate 100 is wire-bonded with only one of the semiconductor chips 110, 120, and 130, vertical intervals between wires are not required because only one semiconductor chip is wire-bonded to the mounting substrate 100. Also, in the example embodiments, the additional pads may be arranged where the pad group are in the central portion of the semiconductor chip, and therefore the sufficient margin for the distance between the additional pads can be assured. Thus, additional area expansion for maintaining horizontal intervals between the wires may not be necessary, and a miniaturized package may be achieved even though the wire bonding is used.

According to the example embodiment, the pad groups of the semiconductor chips having different sizes may be arranged at the same positions (e.g., at the same coordinates with reference to a desired location). The semiconductor chips may be stacked and connected with the pad groups corresponding to one another. Since each pad of the pad group may be formed as a through hole via, the semiconductor chips having different sizes may be stacked without multiple wire bonding layers.

Even though the pad groups may be disposed at the center of the semiconductor chip in the example embodiment, the pad group may be arranged at an edge portion of the semiconductor chip.

Figure 10:
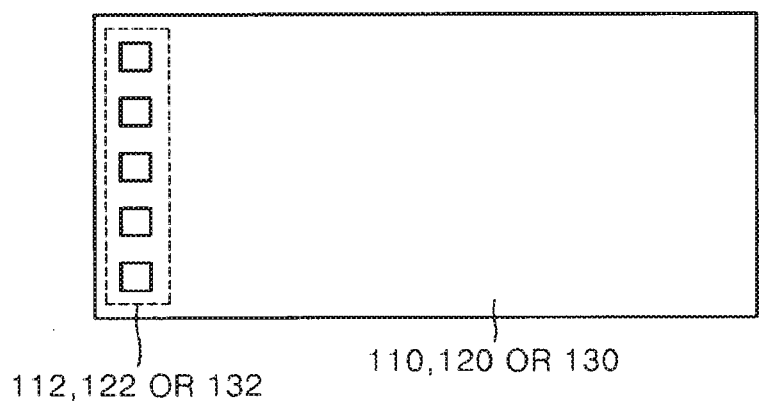
FIGS. 10 and 11 are plan views of a multi-chip package in which each of a plurality of semiconductor chips has an edge pad group according to an example embodiment of the present invention.
Figure 11:
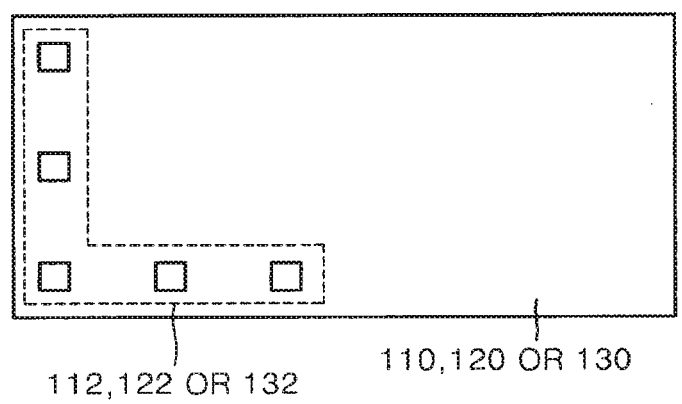

That is, pad groups 112, 122 and 132 may be arranged at an edge portion of the semiconductor chips 110, 120 or 130, respectively, as illustrated in FIG. 10, or may be arranged in the form of "L" shape along edges of the semiconductor chip 110, 120 and 130 as illustrated in FIG. 11.

Figure 13:
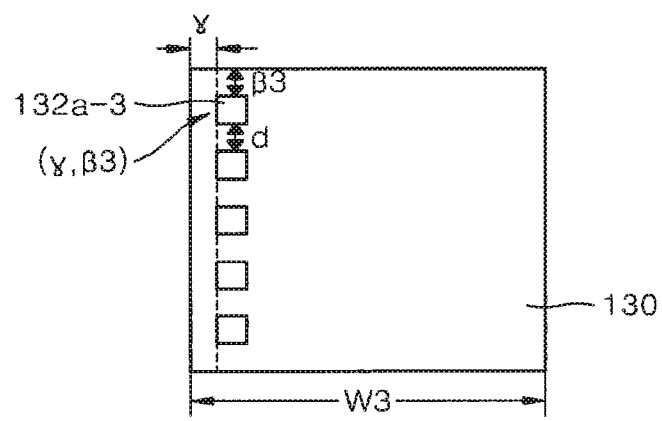
FIG. 13 is a plan view illustrating location of pads of the plurality of semiconductor chips of FIG. 12, according to an example embodiment of the present invention.
Figure 13:
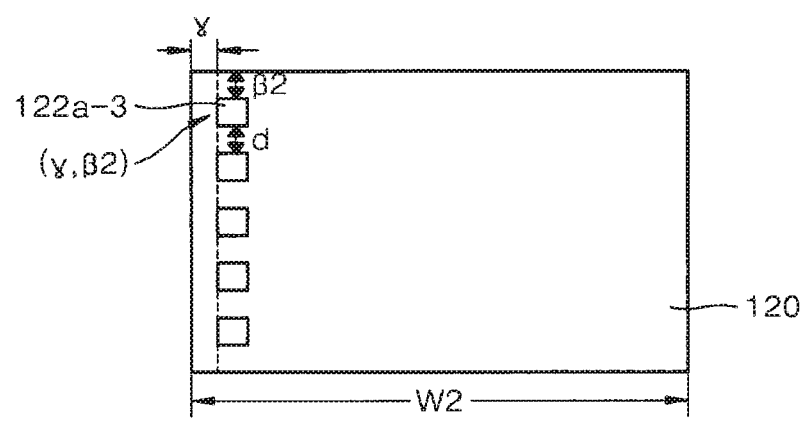
Figure 13:
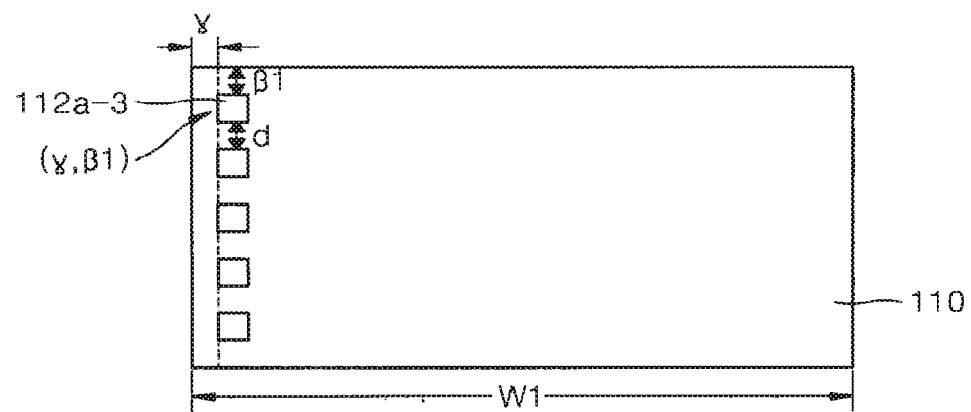

As illustrated in FIG. 13, pads 112a, 122a and 132a may be arranged at a desired distance ($\gamma$) from an edge of the semiconductor chips 110, 120 and 130, so that the pad groups 112, 122, and 132 may correspond to one another when the semiconductor chips 110, 120, and 130 are stacked. That is, the pads 112a, 122a and 132a may be arranged such that coordinates of a pad 112a-3 on the uppermost row of the first semiconductor chip 100 is ($\gamma$, $\beta$1), coordinates of a pad 122a-3 on the uppermost row of the second semiconductor chip 120 is ($\gamma$, $\beta$2), and coordinates of a pad 132a-3 on the uppermost row of the third semiconductor chip 110 is ($\gamma$, $\beta$3). A pad on the next row (e.g., the second uppermost row) is arranged at a "d" distance from the pad on the uppermost row, and remaining pads on the next rows are arranged at the distance "d" along the y-coordinate axis from the previous row. The values of $\beta$1, $\beta$2, and $\beta$3 may be the same, or may increase in the order of $\beta$1, $\beta$2, and $\beta$3 in proportion to the widths of the semiconductor chips 110, 120, and 130.

Figure 12:
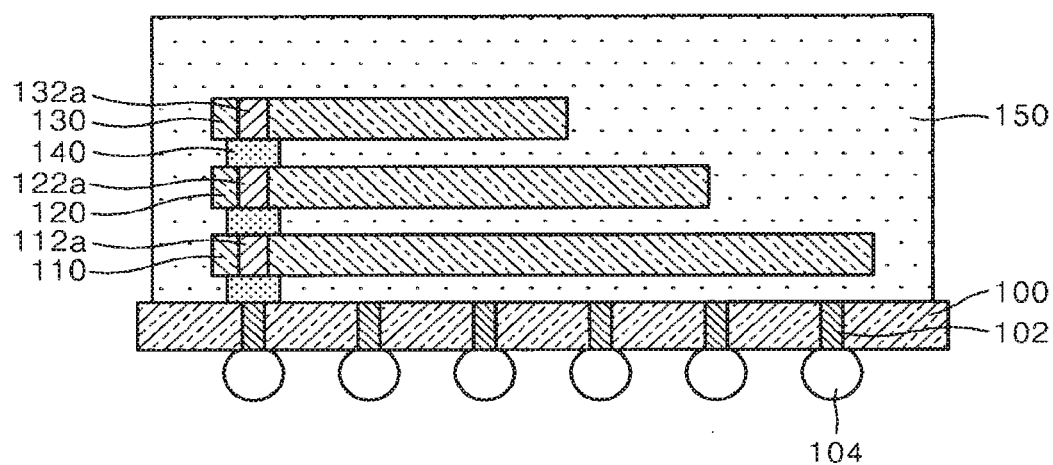
FIG. 12 is a cross-sectional view of a multi-chip package in which each of a plurality of semiconductor chips has an edge pad group according to an example embodiment of the present invention.

When the pad groups 112, 122, and 132 are arranged at an edge portion of the semiconductor chips 110, 120 and 130, the semiconductor chips 110, 120 and 130 may be stacked with one of their sides aligned with each other as shown in FIG. 12. As described in the above aforementioned example embodiment, the pads 112a, 122a and 132a may be formed as a through hole via and may be connected to one another by bumps 140. Also, the semiconductor chips 110, 120, and 130 and the mounting substrate 100 may be connected together by a bump 140 and/or a wire as in the above aforementioned example embodiment. Also, the semiconductor chips 110, 120, and 130 may be stacked with their active surfaces facing the same direction, facing each other or in other various combinations thereof.

Figure 14:
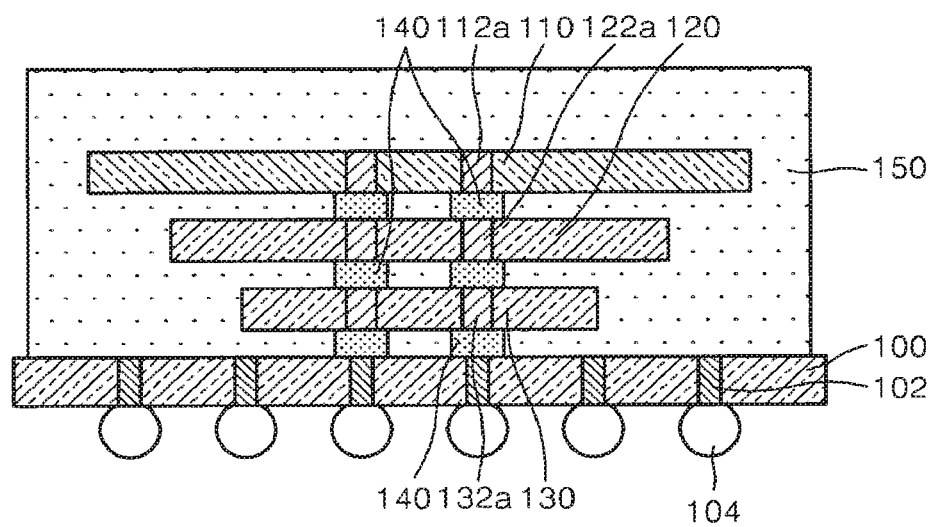
FIGS. 14 and 15 are cross-sectional views of a multi-chip package according to another example embodiment of the present invention.
Figure 15:
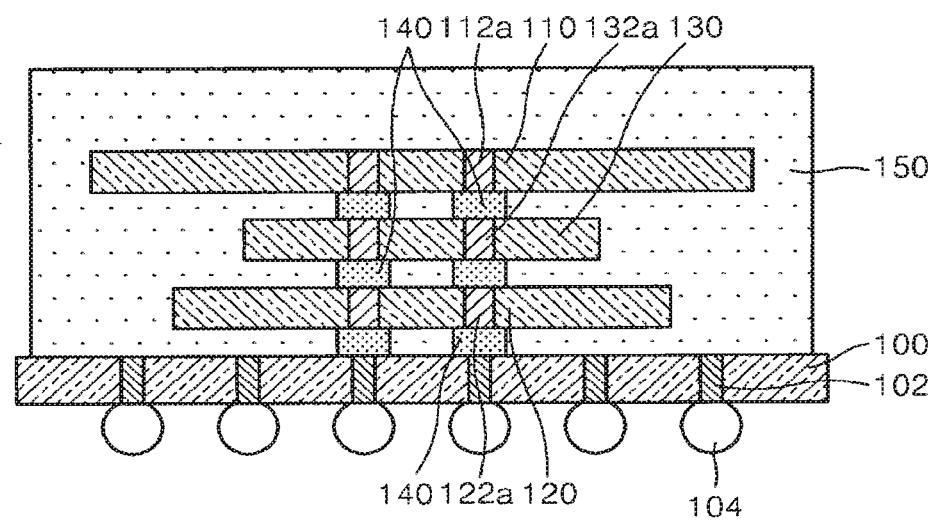

In the above aforementioned example embodiment, the semiconductor chips 110, 120, and 130 may be stacked progressively decreasing in size from bottom to top. However, the semiconductor chips 110, 120, and 130 may be stacked progressively increasing in size from bottom to top as illustrated in FIG. 14, the semiconductor chip 130 having the smallest size may be inserted in the middle as illustrated in FIG. 15, or any other combination thereof. Furthermore, the number of semiconductor chips may be greater than three (3).

Figure 16A:
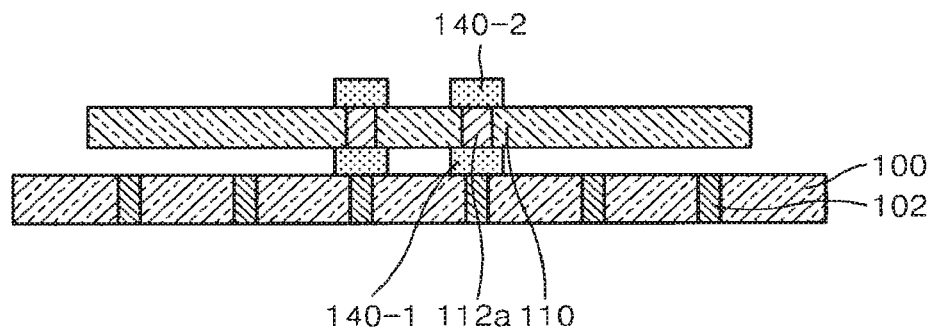
FIGS. 16A and 16B are cross-sectional views illustrating a method of manufacturing a multi-chip package according to an example embodiment of the present invention.
Figure 16B:
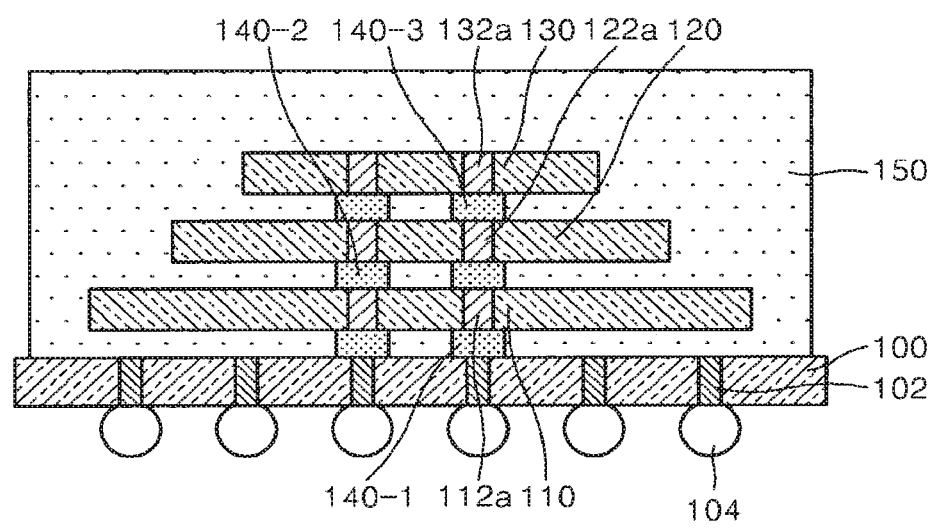

FIGS. 16A and 16B are cross-sectional views illustrating a method of manufacturing a multi-chip package according to an example embodiment of the present invention.

Referring to FIG. 16A, a mounting substrate 100 having a plurality of studs 102 may be provided. Bumps 140-1 may be formed on selected studs 102 of the mounting substrate 100, and then, a first semiconductor chip 110 having pads 112a may be stacked on the mounting substrate 100. The first semiconductor chip 110 may be stacked with the pads 112a contacting the first bumps 140-1. Then, second bumps 140-2 may be formed on the exposed portion of pads 112a of the first semiconductor chip 110.

Referring to FIG. 16B, a second semiconductor chip 120 having pads (e.g., through hole vias) 122a may be provided and stacked on the first semiconductor chip 110 with the pads 122a contacting the second bumps 140-2. Then, third bumps 140-3 may be formed on the exposed pads 122a of the second semiconductor chip 120. A third semiconductor chip 130 having pads (e.g., through hole vias) 132a may be provided and stacked on the second semiconductor chip 120 with the pads 132a contacting the third bumps 140-3. Then, a sealing material 150 may be formed on the mounting substrate 100 to encapsulate the first through third semiconductor chips 110, 120, and 130. Conductive balls 104 may be attached underneath the mounting substrate 100. Each of the first, second, and third semiconductor chips 110, 120, and 130 may be an individual semiconductor device.

Figure 17A:
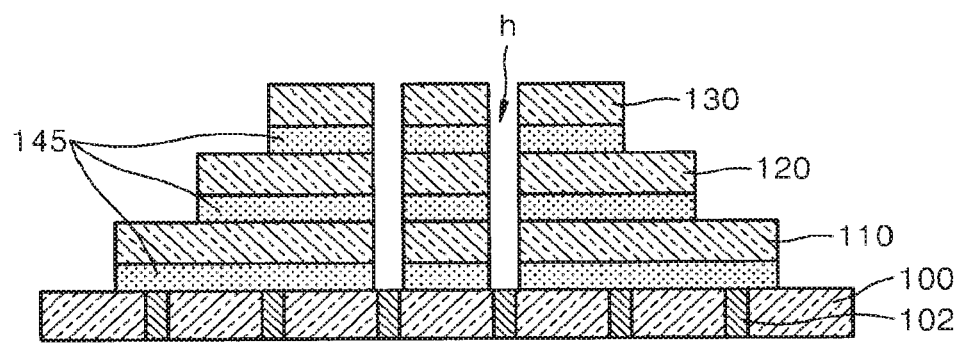
FIGS. 17A and 17B are cross-sectional views illustrating a method of manufacturing a multi-chip package according to another example embodiment of the present invention.
Figure 17B:
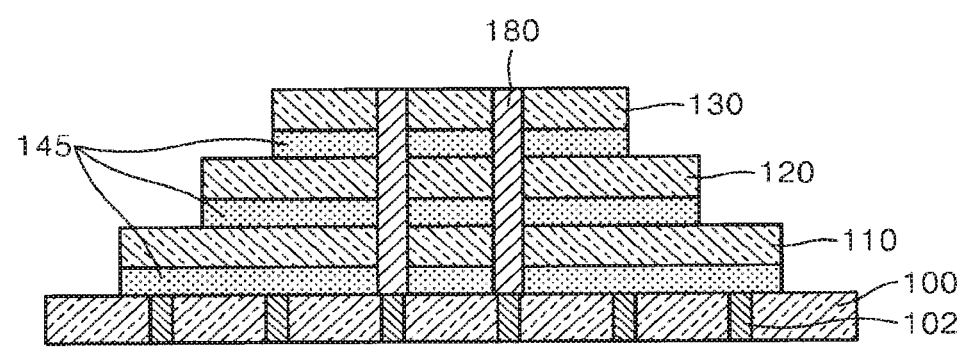

FIGS. 17A and 17B are cross-sectional views illustrating processes of manufacturing a multi-chip package according to another example embodiment of the present invention.

Referring to FIG. 17A, an adhesive layer 145 may be formed on a mounting substrate 100 including a plurality of studs 102, and then a first semiconductor chip 110 may be attached onto the adhesive layer 145. In the first semiconductor chip 110, a pad area may not be filled with a conductive material, and therefore, may remain as a hole (h). The adhesive layer 145 does not form at portions at which the hole (h) is located. Therefore, an adhesive layer 145 may be formed on the first semiconductor chip 110, excluding the hole (h) portion, and a second semiconductor chip 120 may be attached onto the semiconductor chip 110. Like the first semiconductor chip 110, the semiconductor chip 120 has a pad area remaining as a hole, which is not filled with a conductive material, and the holes of the respective first and second semiconductor chips 110 and 120 correspond to each other. An adhesive layer 145 may be formed again on the semiconductor chip 120, exposing a region of the hole (h), and a third semiconductor chip 130 may be attached onto the second semiconductor chip 120. The third semiconductor chip 130 also has a pad area remaining as a hole, and the hole of the third semiconductor chip 130 may be disposed to correspond to the holes of the second and third semiconductor chips 120 and 130.

Then, as illustrated in FIG. 17B, the holes of the first, second and third semiconductor chips 110, 120 and 130 may be filled with a conductive material 180, thereby concurrently forming the pads and bumps. The proceeding processes may be the same as those described in the aforementioned example embodiment.

In example embodiments of the present invention, the semiconductor chips are stacked in a state where through hole vias are present in the pad regions thereof, and then the through hole vias are filled with a conductive material, thereby manufacturing pads and bumps at the same time.

Although the pads may be arranged in dual columns or a single column as illustrated in the example embodiments, the example embodiments are not limited thereto and the pads may be arranged in various ways.

Also, even though the pad group may be placed at a central or edge portion of the semiconductor, the example embodiments are not limited thereto, and the pad group may be formed at various positions.

In addition, in the example embodiments, a substrate to which the semiconductor chip is mounted may be a printed circuit board. However, a ceramic, a lead frame, a circuit tape, a circuit film, or the like may be used. Also, a conductive ball may be used as a unit for external electrical connection. However, other connection units, for example, bumps, may be used.

Pads of semiconductor chips having different sizes may be formed as through hole vias, and the semiconductor chips having different sizes may be stacked such that the pads correspond to and contact one another. Accordingly, a multiple wire bonding is not performed on the multi-chip package according to the example embodiments, so that a package may have a significant reduction in size and weight. Also, effects of a wafer level package may be obtained even though the semiconductor chips are stacked at the chip level in the package.

While the example embodiments have been shown and described, it will be understood by those of ordinary skill in the art that various changes in form and details may be made therein without departing from the scope of the example embodiments.

What is claimed is:

1. A semiconductor device comprising:
   a first chip including a first column of pads and a second column of pads, each of the pads in the first column of pads and the second column of pads penetrating the first chip, the first column of pads and the second column of pads being disposed along a centerline of the first chip and symmetric with respect to the centerline of the first chip, and the first column of pads and the second column of pads being adjacent the centerline of the first chip, wherein a first distance between the first column of pads and the second column of pads is longer than a second distance between adjacent pads in the first column of pads or in the second column of pads; and
   a second chip, being different in size from the first chip and stacked on the first chip, including a third column of pads and a fourth column of pads, each of the pads in the third column of pads and the fourth column of pads penetrating the second chip, the third column of pads and the fourth column of pads being disposed along a centerline of the second chip and symmetric with respect to the centerline of the second chip, and the third column of pads and the fourth column of pads being adjacent the centerline of the second chip,
   wherein the first column of pads and the third column of pads are identical in number of pads, equally distant from the centerline of the first chip and the centerline of the second chip respectively, and vertically connected, and
   wherein the second column of pads and the fourth column of pads are identical in number of pads, equally distant from the centerline of the first chip and the centerline of the second chip respectively, and vertically connected.

2. The semiconductor device of claim 1, wherein the size of the first chip is greater than that of the second chip.

3. The semiconductor device of claim 1, wherein active surface of the first chip and active surface of the second chip are facing downward.

4. The semiconductor device of claim 1, wherein the first column of pads and the third column of pads are connected each other through first bumps, and the second column of pads and the fourth column of pads are connected each other through second bumps.

5. The semiconductor device of claim 1, wherein the first chip and the second chip perform different functions respectively.

6. The semiconductor device of claim 1, wherein a size of each pad in the first, second, third and fourth columns of pads is greater than 30 μm and smaller than 300 μm.

7. The semiconductor device of claim 1, wherein the second chip is one of a dynamic random access memory (DRAM), static random access memory (SRAM) and flash memory.

8. The semiconductor device of claim 1, wherein a gap between the first chip and the second chip is filled with adhesive material.

9. The semiconductor device of claim 1, wherein the semiconductor device further comprising a third chip including a fifth column of pads and a sixth column of pads, the fifth column of pads being connected with third column of pads and the sixth column of pads being connected with fourth column of pads.

10. The semiconductor device of claim 1, wherein the semiconductor device further comprising a plurality of chips stacked on the second chip, and an uppermost chip of the plurality of chips not including pads penetrating through the uppermost chip.

11. The semiconductor device of claim 1, wherein the semiconductor device further comprising a substrate on which the first chip and the second chip are stacked.

12. A semiconductor device comprising:
    a first chip including a first column of pads, each of the pads in the first column of pads penetrating the first chip, the first column of pads being disposed along a first edge of the first chip and having a first distance from the first edge; and
    a second chip, being different in size from the first chip and stacked on the first chip, including a second column of pads, each of the pads in the second column of pads penetrating the second chip, the second column of pads being disposed along a second edge of the second chip and having a second distance from the second edge,
    wherein the first edge of the first chip and the second edge of the second chip are vertically aligned, and
    wherein the first column of pads and the second column of pads are identical in number of pads, and equally distant from the first edge of the first chip and the second edge of the second chip respectively, and vertically connected.

13. The semiconductor device of claim 12, wherein the size of the first chip is greater than that of the second chip.

14. The semiconductor device of claim 12, wherein both active surface of the first chip and active surface of the second chip are facing downward.

15. The semiconductor device of claim 12, wherein the first column of pads and the second column of pads are connected each other through bumps.

16. The semiconductor device of claim 12, wherein the first chip and the second chip perform different functions respectively.

17. The semiconductor device of claim 12, wherein a size of each pad in the columns of pads is greater than 30 μm and smaller than 300 μm.

18. The semiconductor device of claim 12, wherein the second chip is one of a dynamic random access memory (DRAM), static random access memory (SRAM) and flash memory.

19. The semiconductor device of claim 12, wherein a gap between the first chip and the second chip is filled with adhesive material.

20. The semiconductor device of claim 12, wherein the semiconductor device further comprising a third chip including a third column of pads, the third column of pads being connected with second column of pads.

* * * * *